US010788557B2

(12) United States Patent
Zeller

(10) Patent No.: US 10,788,557 B2
(45) Date of Patent: Sep. 29, 2020

(54) METHOD AND COMPUTER FOR PRODUCING A PULSE SEQUENCE FOR OPERATING A MAGNETIC RESONANCE TOMOGRAPHY APPARATUS

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 16/388,240

(22) Filed: Apr. 18, 2019

(65) Prior Publication Data

US 2019/0324105 A1    Oct. 24, 2019

(30) Foreign Application Priority Data

Apr. 18, 2018    (DE) .................... 10 2018 205 867

(51) Int. Cl.

| G01R 33/56 | (2006.01) |
|---|---|
| G01R 33/561 | (2006.01) |
| G01R 33/54 | (2006.01) |
| G01R 33/385 | (2006.01) |
| G01R 33/483 | (2006.01) |
| G01R 33/48 | (2006.01) |

(52) U.S. Cl.
CPC ........ *G01R 33/5611* (2013.01); *G01R 33/385* (2013.01); *G01R 33/4818* (2013.01); *G01R 33/4835* (2013.01); *G01R 33/543* (2013.01)

(58) Field of Classification Search
CPC .............. G01R 33/5611; G01R 33/543; G01R 33/385; G01R 33/4835; G01R 33/4818; G01R 33/4826
See application file for complete search history.

(56) References Cited

U.S. PATENT DOCUMENTS

| 4,647,858 A | * | 3/1987 | Bottomley | ........... G01R 33/385 |
|---|---|---|---|---|
| | | | | 324/320 |
| 4,777,956 A | * | 10/1988 | Macovski | ............ G01R 33/563 |
| | | | | 324/306 |

(Continued)

OTHER PUBLICATIONS

Kim, Tae Hyung et al.: "Wave-LORAKS for faster Wave-CAIPI MRI"; in:Proc. Intl. Soc. Mag. Reson. Med. 25; 2017;.

(Continued)

*Primary Examiner* — G.M. A Hyder
(74) *Attorney, Agent, or Firm* — Schiff Hardin LLP

(57) ABSTRACT

In a method for creating a pulse sequence for controlling a magnetic resonance tomography apparatus as part of a CAIPIRINHA readout method for generating magnetic resonance image data of an examination object, two or more readout gradients and encoding gradients are used, wherein a readout gradient is positioned on a gradient axis and an encoding gradient is positioned on another gradient axis so as to occur simultaneously with the readout gradient. The encoding gradient has a periodic waveform. This positioning is repeated at different times in the pulse sequence, with the sampling density of a readout gradient being varied during a readout process, and/or the amplitude of the encoding gradients and/or of the readout gradients being varied for different readout processes.

12 Claims, 6 Drawing Sheets

(56) References Cited

U.S. PATENT DOCUMENTS

| | | | | |
|---|---|---|---|---|
| 4,871,966 | A * | 10/1989 | Smith | G01R 33/385 |
| | | | | 324/309 |
| 5,560,361 | A * | 10/1996 | Glusick | G01R 33/561 |
| | | | | 324/307 |
| 6,255,820 | B1 | 7/2001 | Steckner | |
| 2013/0099784 | A1* | 4/2013 | Setsompop | G01R 33/4826 |
| | | | | 324/309 |
| 2017/0219672 | A1* | 8/2017 | Miyazaki | G01R 33/4835 |
| 2017/0356972 | A1* | 12/2017 | Wheaton | G01R 33/4822 |
| 2019/0113587 | A1* | 4/2019 | Paulson | G01R 33/4835 |
| 2019/0324105 | A1* | 10/2019 | Zeller | G01R 33/4818 |

OTHER PUBLICATIONS

Chen, Feiyu et al.: "Self-Calibrating Wave-Encoded Variable-Density Single-Shot Fast Spin Echo Imaging."; in: Journal of Magnetic Resonance Imaging; 2017; DOI: 10.1002/jmri.25853;.

Bilgic, Berkin et al. "Wave-CAIPI for Highly Accelerated 3D Imaging" Magnetic Resonance in Medicine, vol. 73, No. 6, pp. 2152-2162, 2015 // DOI: 10.1002/mrm.25347; and.

Gagoski, Borjan A. et al. "RARE/Turbo Spin Echo Imaging with Simultaneous Multislice Wave-CAIPI" Magnetic Resonance in Medicine; vol. 73; pp. 929-938; 2015 // DOI: 10.1002/mrm.2561.

German Action dated Jul. 13, 2020, Application No. 10 2018 205 867.9.

* cited by examiner

METHOD AND COMPUTER FOR PRODUCING A PULSE SEQUENCE FOR OPERATING A MAGNETIC RESONANCE TOMOGRAPHY APPARATUS

BACKGROUND OF THE INVENTION

Field of the Invention

The invention concerns a method and a computer for producing a pulse sequence for operating a magnetic resonance (MR) tomography apparatus as part of a CAIPIRINHA readout method. The invention also concerns a corresponding control method and a corresponding magnetic resonance tomography system.

Description of the Prior Art

Magnetic resonance tomography systems have become an indispensable part of modern medicine. However, one of the greatest challenges facing magnetic resonance imaging is the long time required for an MR scan compared to other systems. Various acquisition techniques seek to address this problem through various technical approaches and depend on the required examination, i.e. the different applications of the magnetic resonance imaging and the body regions of interest.

One of these acquisition techniques is known by the term "CAIPIRINHA". The acronym "CAIPIRINHA" stands for "Controlled Aliasing in Parallel Imaging Results in Higher Acceleration". This imaging technique, also known as "CAIPI" for short, is often used for 3D breath-hold abdominal imaging.

CAIPIRINHA uses a group of unique k-space sampling patterns to reduce pixel aliasing and overlap in reconstructed images. The points in k-space accessible to the scan are shifted relative to one another by applying additional offsets to the phase-encoding gradient tables.

CAIPIRINHA is currently often used for 3D liver studies or head examinations in which images can be obtained in rapid succession during contrast uptake. Other possible applications of CAIPIRINHA include diffusion-weighted imaging and magnetic resonance angiography (MRA).

An enhancement of the CAIPIRINHA acquisition technique for many applications such as head scans, for example, is achieved by a variant known as "Wave-CAIPI" (see e.g. "RARE/Turbo Spin Echo Imaging with Simultaneous Multislice Wave-CAIPI"; Bilgic et al., Magnetic Resonance in Medicine 73:929-938 (2015)). This acquisition technique allows highly accelerated MR imaging compared to other CAIPIRINHA methods. This is achieved by sinusoidal modulation of "Wave-CAIPI gradients" (see Bilgic et al.) taking place in this example on the $k_y$ and/or $k_z$ axis during application of the readout gradient (e.g. on the $k_x$ axis), resulting in "smearing" and therefore incoherent information distribution. The Wave-CAIPI methods can be used both in three-dimensional imaging (e.g. GRE, 3D RARE, MP-RAGE) and in two-dimensional imaging (e.g. RARE).

Two methods have recently emerged that enable Wave-CAIPI imaging to be accelerated still further by variable-density sampling of k-space (see "Self-Calibrating Wave-Encoded Variable-Density Single-Shot Fast Spin Echo Imaging"; Chen et al., J Magn Reson Imaging, 2017 and "Wave-LORAKS for faster Wave-CAIPI MRI"; Kim et al., ISMRM 2017, 1037). These methods vary the k-space density by varying the distances between the k-space centers of the respective readout processes (cf. FIG. 1), but allow the amplitudes of the gradients involved to remain constant between the individual readout processes.

The disadvantage of the known Wave-CAIPI methods is that their acquisition speed is not yet optimal.

SUMMARY OF THE INVENTION

An object of the present invention is to provide an improved method and computer for creating a pulse sequence for controlling a magnetic resonance tomography apparatus as part of a CAIPIRINHA readout method, a corresponding control method as well as a corresponding magnetic resonance tomography apparatus with which the disadvantages described above are avoided.

The method according to the invention creates a pulse sequence for controlling a magnetic resonance tomography apparatus as part of a CAIPIRINHA readout method in order to generate magnetic resonance image data of an object under examination, such as a body region of a patient. The pulse sequence has two or more readout gradients and encoding gradients. An encoding gradient can have e.g. the shape of a "Wave-CAIPI gradient" (see Bilgic et al.), but this is not absolutely necessary.

The method according to the invention includes the following steps:

Positioning of a Readout Gradient

A readout gradient is positioned on one of the gradient axes. A magnetic resonance tomography scanner generally has a total of three gradient axes in order to be able to cover a three-dimensional space during the acquisition.

Positioning (at Least) One Encoding Gradient

The encoding gradient is a gradient switched during the readout process. At least one encoding gradient is positioned on one of the (two) gradient axes so as to occur simultaneously with the readout gradient. The term "simultaneously" means not necessarily the rising or falling edge of the readout gradient (although these can obviously be included) but rather the region of the readout gradient that is relevant for the readout in practice.

The encoding gradient has a periodic waveform, preferably that of a sinusoidal wave. This periodic waveform need not necessarily relate to the entire evolution of the encoding gradient, but must at least predominate for most of the readout.

The encoding gradient includes a phase-encoding gradient at the beginning and end, wherein the encoding gradient in this case corresponds to the pattern phase-encoding gradient—wave-encoding gradient—phase-encoding gradient. An encoding gradient in the form of a "Wave-CAIPI gradient" can have e.g. according to the abovementioned prior art (see Bilgic et al.) a "blipped-CAIPI gradient" as the phase-encoding gradient before and after a "sinusoidal gradient".

Repetition of the Positioning

In this step another readout gradient and (at least) one encoding gradient is positioned on another section of the pulse sequence in the manner described above. This step is preferably carried out repeatedly so that a number of readout gradients and encoding gradients are present at different times in the pulse sequence.

The positioning can take place for a number of readout gradients such that all the readout gradients are always positioned on the same gradient axis, but, depending on the application, different readout gradients (at different times in the pulse sequence) can also be positioned on different gradient axes.

According to the invention at least one of the following variations is applied:

With regard to the readout gradient, its sampling density can be varied during a readout process. In this context, variation of the readout amplitude can be performed. Instead of a constant readout gradient, the gradient amplitude is therefore varied during the readout process in order e.g. to achieve denser sampling of the k-space center in the readout direction. Alternatively or in addition, the readout bandwidth of the reading-out unit, e.g. of an ADC (analog-digital converter), can be varied. This also allows denser sampling of the k-space center in the readout direction.

Alternatively or additionally, the amplitude of the encoding gradients and/or of the readout gradients can be varied for different readouts. These amplitudes are constant for a given readout but differ in respect of different readouts.

Readout gradients and/or encoding gradients therefore vary compared to readout gradients and/or encoding gradients at other time positions in the pulse sequence so that in at least one position in the pulse sequence a readout gradient is present which is different from another readout gradient and/or an encoding gradient is present which is different from another encoding gradient at another point in time. In practice it is highly advantageous if, at least within a repetition or a concatenation, (essentially) each readout gradient or encoding gradient(s) group (here also termed "sequence group") differs from (essentially) all the other sequence groups at a point in time in the pulse sequence.

With this method, an additional density variation is achieved by varying the gradients during the readouts. Moreover, by particular variation that is used, scaling of the encoding gradient amplitude as a function of the $k_y/k_z$ space position of the readout is possible. By means of selective variation, sampling with higher k-space density can take place close to the k-space center, whereas a lower density is selected in the k-space periphery. The scaling can take place uniformly in the $k_y/k_z$-direction or with different scaling. Similarly, the method can also be applied in particular to 2D-Wave-CAIPI. Here a single encoding gradient can be varied in the $k_y$-direction depending on the k-space position.

The two embodiments can be combined in order to enable the density to be varied in all the k-space coordinates.

A pulse sequence according to the invention for controlling a magnetic resonance tomography system as part of a CAIPIRINHA readout method for generating magnetic resonance image data of an examination object is created according to an inventive method.

The pulse sequence includes a readout gradient positioned on a gradient axis, together with an encoding gradient, having a periodic waveform that is simultaneously positioned on another gradient axis (or on both other gradient axes). This positioning of a readout gradient and of an encoding gradient is repeated at different times in the pulse sequence, so that sequence groups of inventively positioned readout gradients and encoding gradients are present at different points in time of the pulse sequence.

A particular feature of the pulse sequence is that readout gradients and encoding gradients vary, with the sampling density of a readout gradient varying during a readout process, and/or the amplitude of the encoding gradients and/or of the readout gradients varying for different readout processes.

A computer according to the invention for creating a pulse sequence according to the invention is designed to create a pulse sequence having a readout gradient on one of the gradient axes and a simultaneously positioned encoding gradient having a periodic waveform on at least one of the two other gradient axes, wherein this positioning of a readout gradient and of (at least) one encoding gradient (sequence group) is repeated at different times in the pulse sequence.

The computer is designed to position readout gradients and/or encoding gradients such that the sampling density of a readout gradient varies during a readout process, and/or the amplitude of the encoding gradients and/or of the readout gradients varies for different readout processes.

In a control method according to the invention for controlling a magnetic resonance tomography apparatus for generating magnetic resonance image data of an examination object as part of a CAIPIRINHA readout method, a pulse sequence according to the invention is applied as part of a magnetic resonance tomography scan of the magnetic resonance tomography system.

It is preferred that a pulse sequence according to the invention is created or provided and then applied, but it is also possible to provide a conventional pulse sequence and to model it (e.g. by means of controllable resistances on the gradient axes) such that, when it is applied, a pulse sequence according to the invention is produced.

A control computer according to the invention for controlling a magnetic resonance tomography apparatus is designed to carry out the method according to the invention and/or to include a pulse-generating computer according to the invention.

A magnetic resonance tomography apparatus according to the invention has a control computer according to the invention.

Particular advantages of the invention are increased incoherence of the image information and therefore higher possible acceleration factors and a reduced scan time or a higher resolution for the same scan duration.

A large proportion of the aforementioned components of the device and/or control computer can be wholly or partially implemented in the form of software modules in a processor of a corresponding pulse-generating computer and/or control computer. The advantage of a largely software implementation is that existing computers can be simply upgraded by a software update so as to operate according to the invention.

Accordingly, the present invention also encompasses a non-transitory, computer-readable data storage medium encoded with programming instructions that, when the storage medium is loaded into a pulse-generating computer, or into a computer or computer system of an magnetic resonance imaging apparatus, cause the pulse-generating computer, or the computer or computer system of the magnetic resonance apparatus to implement any or all embodiments of the method according to the invention as described above.

To vary the encoding gradient for different readout processes, the amplitude of a periodic signal, e.g. a sinusoidal wave, is preferably modulated by a scalar factor dependent on the positioning of the readout process (the sequence group) in the pulse sequence. This modulation preferably corresponds to mathematical multiplication, by the respective amplitude, of a factor which varies from readout process to readout process but remains constant during a readout process in each case.

To vary the readout gradient for different readout processes, the amplitude of a signal is preferably modulated by a scalar factor dependent on the positioning of the readout process in the pulse sequence. The signal can be constant but can basically take any form (see also the following paragraph). This modulation also preferably corresponds to mathematical multiplication of a factor (varying from readout process to readout process but remaining constant during a readout process in each case) by the respective amplitude.

To vary the sampling density of the readout gradient during a readout, the readout gradient amplitude which originally has a constant waveform is preferably modulated with a non-constant factor. This modulation preferably corresponds to mathematical multiplication of a factor varying during a readout process by the respective amplitude. A preferred variation is an amplitude waveform in which the absolute value of the gradient in the middle of the waveform is less than at the edges, i.e. the amplitude of the readout gradient in the case of a positive amplitude is greater at the start (after the rising ramp) and end (before the falling ramp) than in the middle of the readout. Another variation is a periodic, in particular sinusoidal, waveform.

To vary the sampling density of the readout gradient during a readout process, the sampling density of a readout unit is preferably varied so that a readout process takes place with different sampling densities. Here the sampling density is preferably lower at the start and/or end of a readout process than in the middle part of the readout process. This results in a higher sampling density in the k-space center.

An encoding gradient preferably has a phase-encoding gradient before and after the periodic waveform. A phase-encoding gradient produces controlled dephasing of the spins. It is designed so that the spins dephase at different rates in each image line. This causes the readout signal to be attenuated depending on the position of the transmitting spins along the gradient. The readout is repeated with continuously changing strength of the phase-encoding gradient for as long as image lines are to be calculated. If k-space is considered, the phase-encoding gradients affect the position of the region read out in k-space. The phase-encoding gradient at the start and the phase-encoding gradient at the end of the encoding gradient are preferably complementary to one another in respect of their amplitude.

The pulse sequence is preferably structured so as to be designed for an in particular two-dimensional Wave-CAIPI readout method.

Simultaneously with a readout gradient on one of the gradient axes, encoding gradients are preferably positioned on the other two gradient axes. Here it is preferred that the amplitudes of the two encoding gradients vary for different readout processes. This variation of the two encoding gradients is preferably synchronous, so that both amplitudes are uniformly modulated. Also preferred in this context is the case in which the amplitudes of the two encoding gradients in a sequence group are the same.

Depending on the application, it is also preferred that the amplitudes of the two encoding gradients positioned at the same point in time do not vary synchronously with one another, i.e. one amplitude remains the same, whereas the other amplitude varies, for example.

A control method is preferred wherein, prior to application, a pulse sequence is created according to a method according to the invention or a pulse sequence according to the invention is provided.

DESCRIPTION OF THE PREFERRED EMBODIMENTS

Greatly simplified pulse sequence diagrams are shown below. For better understanding of the invention, the different pulses are represented as a function of time t on a single timeline. In a pulse diagram of a gradient echo sequence, the radio-frequency pulses to be emitted (RF pulses E, $H_i$, $H_1$, $H_2$), and the gradient pulses are normally shown on different time axes one above the other, as in FIGS. 1 and 2. The RF pulses E, $H_i$, $H_1$, $H_2$ are usually shown on an RF pulse time axis and the gradient pulses on three gradient pulse time axes which correspond to three spatial directions. The gradient pulses, readout gradients A1, A2 and encoding gradients $C1_y$, $C2_y$, $C1_z$, $C2_z$ shown below can therefore be subdivided over the three gradient axes in respect of their amplitudes, and therefore oriented in space as required.

The following figures mainly identify elements essential to the invention or helpful for the understanding thereof.

Figure 1:
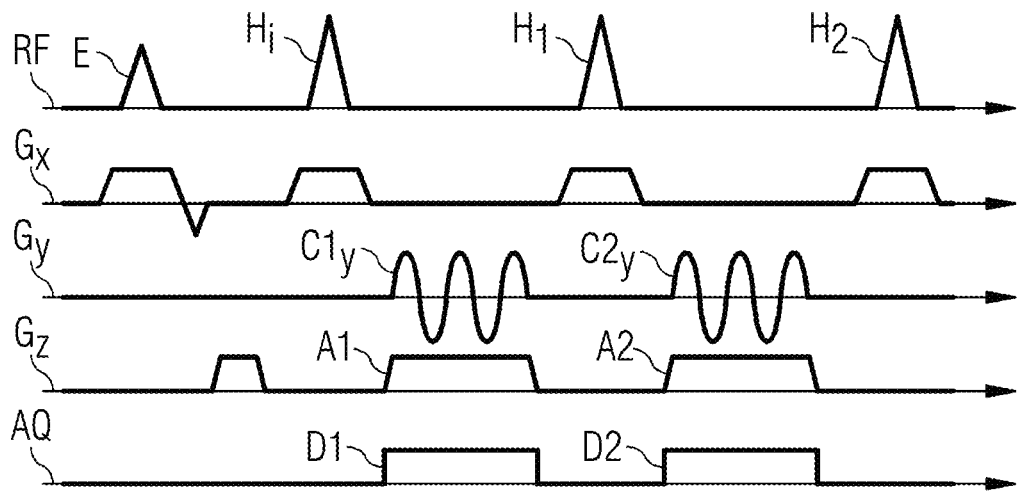
FIG. 1 shows a prior art pulse sequence that can result from the method according to the invention.

FIG. 1 shows an example of a pulse sequence PS according to the prior art. The time runs from left to right in the direction of the arrow. The pulse sequence PS initially comprises, on the radio-frequency axis RF, an RF excitation pulse E having a usual duration for pulses of this kind. The RF excitation pulse E is followed by a plurality of refocusing pulses $H_i$, $H_1$, $H_2$.

Gradients are now applied on the gradient axes $G_x$, $G_y$, $G_z$. Here it is here the gradients on the gradient axes $G_y$, $G_z$ in the y and z-direction that constitute the particular feature of the invention. After the initial refocusing pulse $H_i$, a first readout gradient A1 is applied on the gradient axis $G_z$ in the z-direction. A first encoding gradient $C1_y$ is simultaneously applied on the gradient axis $G_y$ in the y-direction. On the acquisition axis, a readout window D1 is opened for a readout unit (e.g. an ADC) which acquires the raw magnetic resonance data.

After the first refocusing pulse H1 a second readout gradient A2 is applied on the gradient axis $G_z$ in the z-direction. A second encoding gradient $C2_y$ is simultaneously applied on the gradient axis $G_y$ in the y-direction and a readout window D2 for the readout unit for data acquisition is opened on the acquisition axis.

It should be noted that the amplitudes of the encoding gradients $C1_y$, $C2_y$ are always of the same size.

Figure 2:
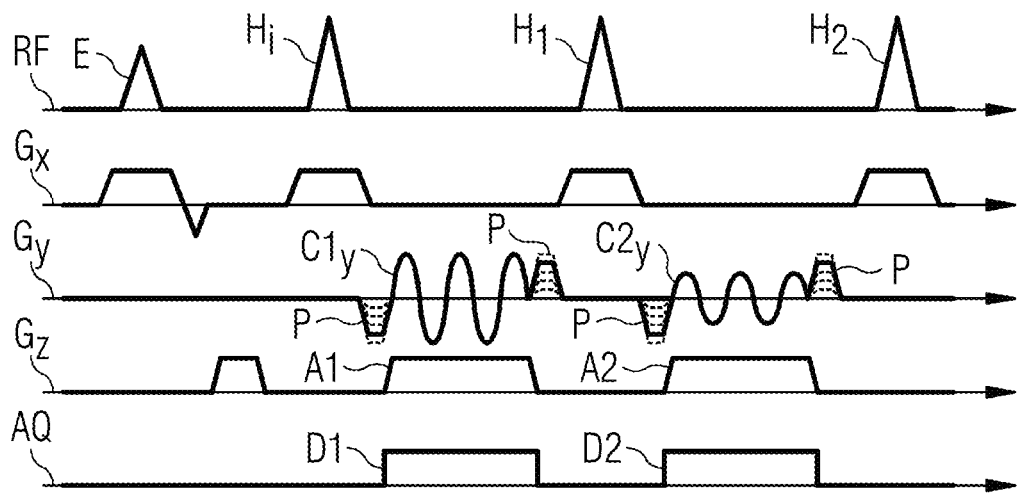
FIG. 2 shows an example of a pulse sequence which can result from the method according to the invention.

FIG. 2 shows an example of a pulse sequence that can result from the method according to the invention. To facilitate comparison, the signals are arranged as already shown in FIG. 1. Here, however, in contrast to the prior art, the amplitudes of the encoding gradients $C1_y$, $C2_y$ differ. In the case of multiple positioning of readout gradients A1, A2 and encoding gradients $C1_y$, $C2_y$, the amplitudes of different encoding gradients $C1_y$, $C2_y$ and/or different readout gradients A1, A2 therefore vary continually, whereas in the prior art they always remain the same.

Before and after their sinusoidal waveform, the encoding gradients $C1_y$, $C2_y$ each comprise phase-encoding gradients P which, depending on continuity, have a different amplitude, as indicated by dashed lines.

The simultaneously positioned readout gradients A1, A2 and encoding gradients $C1_y$, $C1_z$, $C2_y$, $C2_z$ are here also referred to as "sequence group" $SG_1$, $SG_2$, $SG_3$. For clarity, only sequence groups SG1, SG2, SG3 are shown in the subsequent figures.

Figure 3:
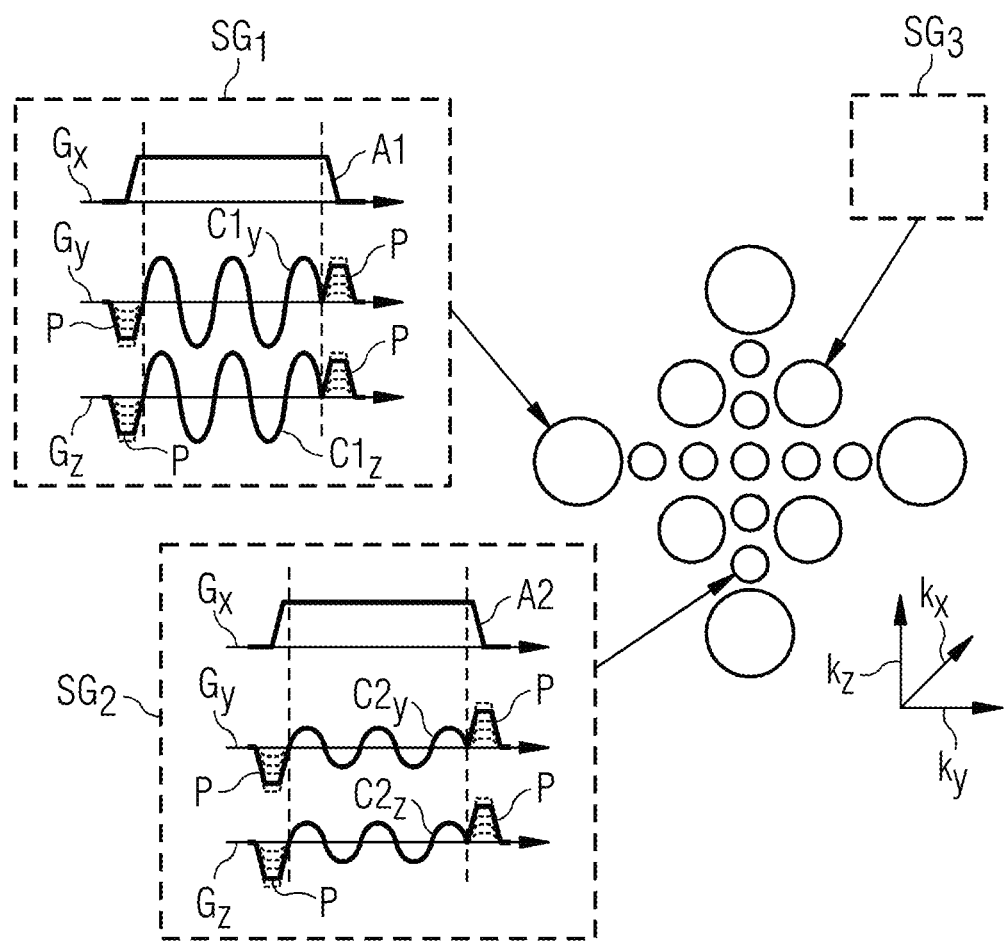
FIG. 3 shows a preferred variation of the encoding gradients in the pulse sequence.

FIG. 3 shows a preferred variation of the encoding gradients $C1_y$, $C1_z$, $C2_y$, $C2_z$ in the pulse sequence. In this example, the readout gradients A1, A2 are applied on the gradient axis $G_x$ in the x-direction and two encoding gradients $C1_y$, $C1_z$ with identical amplitude are applied on the two other gradient axes $G_y$, $G_z$.

Due to the sinusoidal waveform of the encoding gradients $C1_y$, $C1_z$, $C2_y$, $C2_z$ there is produced in k-space a "smearing" of the readout over small expanses which are shown here as circles. The precise shape results from the phase relationship of the two simultaneously applied encoding gradients $C1_y$, $C1_z$, $C2_y$, $C2_z$.

The phase-encoding gradients P shift the readout to a position in k-space which then acts as the center for the circular or rather ellipsoidal shape during the readout in k-space. They therefore affect the position of the circles shown.

According to a preferred embodiment of the invention, the amplitudes of the encoding gradients $C1_y$, $C1_z$, $C2_y$, $C2_z$ are varied. The encoding gradients $C1_y$, $C1_z$ of the first sequence group $SG_1$ have a higher amplitude than the encoding gradients $C2_y$, $C2_z$ of the second sequence group $SG_2$. The amplitudes of the encoding gradients of the third sequence group $SG_3$ lie between the amplitudes of the encoding gradients $C1_y$, $C1_z$, $C2_y$, $C2_z$ of the two other sequence groups $SG_1$, $SG_2$, which is not explicitly represented here. As shown, this produces in k-space a pattern of circles in the Y-Z plane which run helically in the Z-direction.

Figure 4:
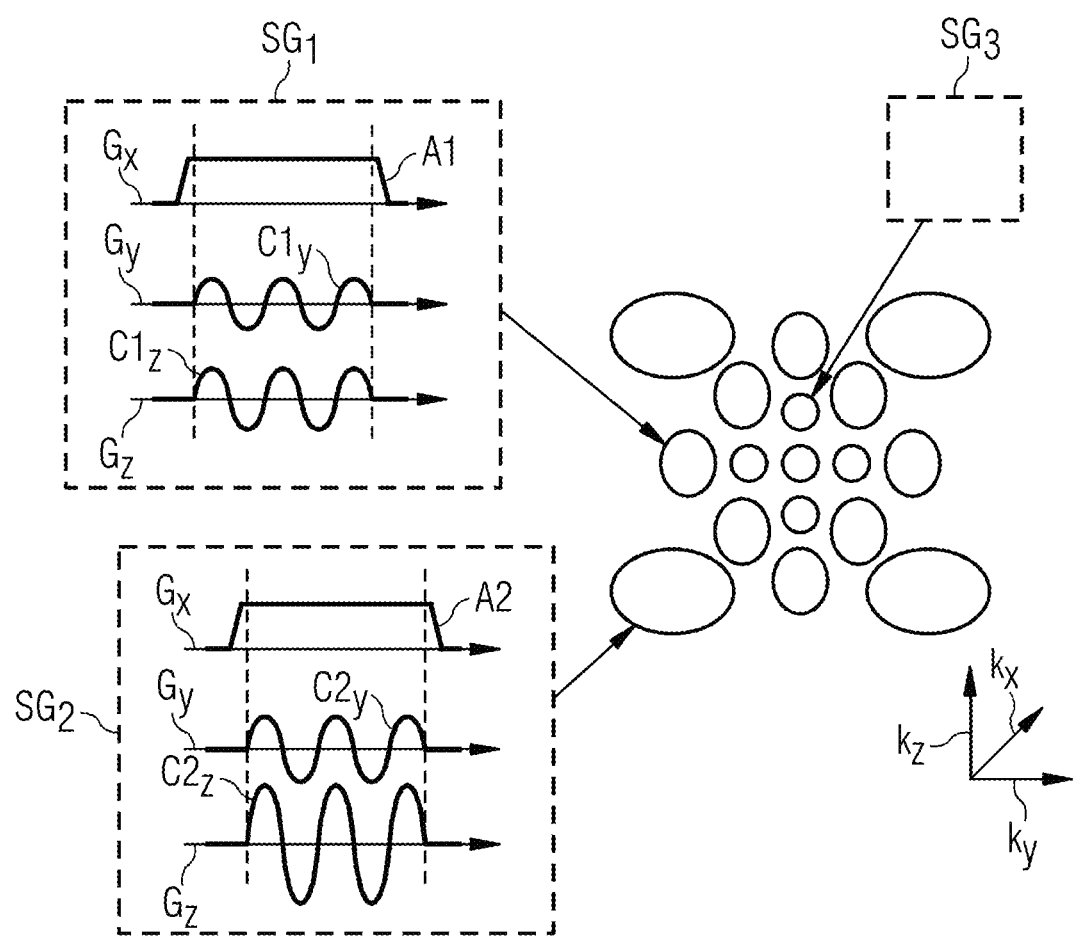
FIG. 4 shows another preferred variation of the encoding gradients in the pulse sequence.

FIG. 4 shows another preferred variation of the encoding gradients $C1_y$, $C1_z$, $C2_y$, $C2_z$ in the pulse sequence. In contrast to FIG. 3, here the amplitudes of the encoding gradients $C1_y$, $C1_z$, $C2_y$, $C2_z$ vary within a sequence group $SG_1$, $SG_2$, which here results in elliptically-shaped regions in k-space. The orientation of the ellipses depends on the phase relationship of the encoding gradients $C1_y$, $C1_z$, $C2_y$, $C2_z$. In this example the encoding gradients of the third sequence group $SG_3$ (not shown) have the smallest amplitudes which do not differ greatly from one another so that virtually circles are covered in k-space.

Figure 5:
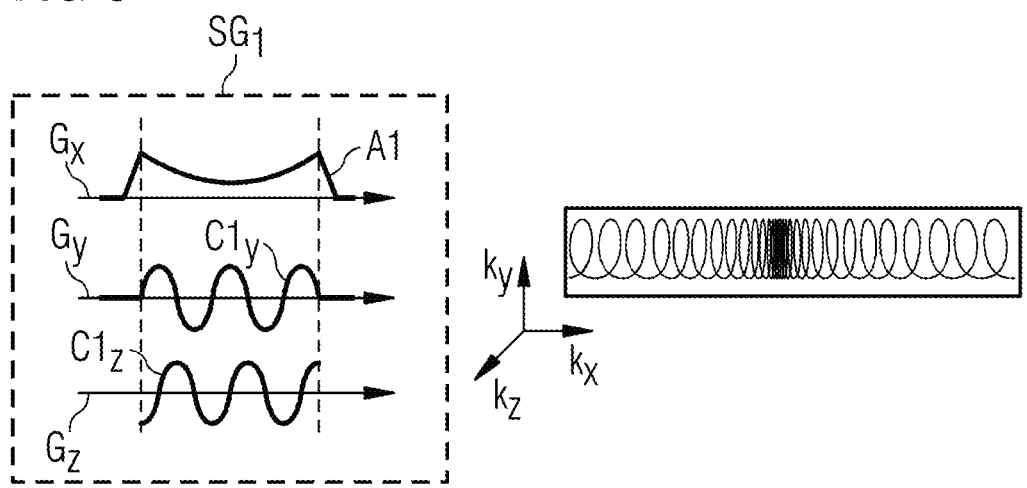
FIG. 5 shows a preferred variation of a readout gradient in the pulse sequence.

FIG. 5 shows a preferred variation of a readout gradient in the pulse sequence PS. In the sequence group $SG_1$ shown, the encoding gradients $C1_y$, $C1_z$ have the same amplitude, but the amplitude of the readout gradient A1 is varied during the readout (arched waveform). The shifted phase relationship of the two encoding gradients $C1_y$, $C1_z$ results in a circular shape in k-space along its x-axis $k_x$. However, because of the variation of the amplitude of the readout gradient, this progression is not uniform in the x-direction, but compressed by differing amounts. This results in more precise sampling in the k-space center.

Figure 6:
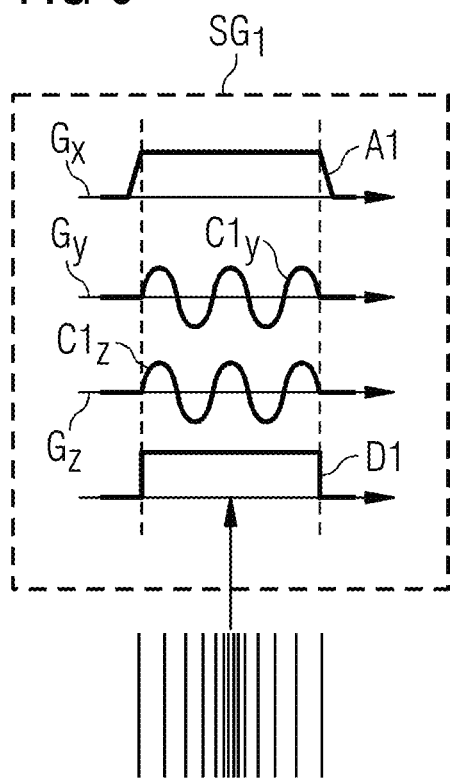
FIG. 6 shows a preferred variation of the sampling.

FIG. 6 shows a preferred sampling variation with which more precise sampling in the k-space center can likewise be achieved. Here the readout window D1 is additionally shown in the sequence group. During data acquisition, the sequence controller 14 can operate a readout unit, e.g. an ADC, so as to be differentially clocked so that it has a coarser time resolution at the start and end of the scan than in the chronological center of data acquisition.

Figure 7:
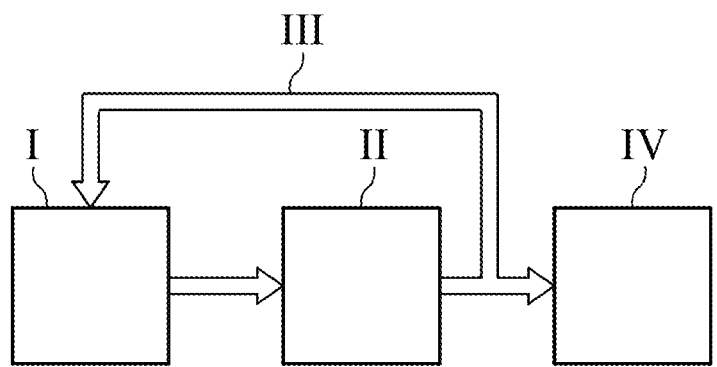
FIG. 7 schematically illustrates an exemplary embodiment of the method according to the invention.

FIG. 7 schematically illustrates an exemplary embodiment of the method according to the invention for creating an inventive pulse sequence PS for controlling a magnetic resonance tomography apparatus 1 as part of a CAIPIRINHA readout method for generating magnetic resonance image data BD of an examination object O.

In step I a readout gradient A1 is applied on a gradient axis $G_x$, $G_y$, $G_z$.

In step II an encoding gradient $C1_y$, $C1_z$ is applied on another gradient axis $G_x$, $G_y$, $G_z$ simultaneously with the readout gradient, wherein the encoding gradient $C1_y$, $C1_z$ has a periodic waveform as shown in the previous figures.

In step III (arrow) an (in particular multiple) repetition of the application of readout gradients A2 and encoding gradients $C2_y$, $C2_z$ takes place at different times in the pulse sequence PS. The sampling density of a readout gradient A1, A2 is varied during a readout process and/or the amplitude of the encoding gradients $C1_y$, $C1_z$, $C2_y$, $C2_z$ or readout gradients A1, A2 is varied for different readout processes.

In step IV the pulse sequence PS for controlling a magnetic resonance tomography apparatus 1 for generating magnetic resonance image data BD of an examination object O is applied.

Figure 8:
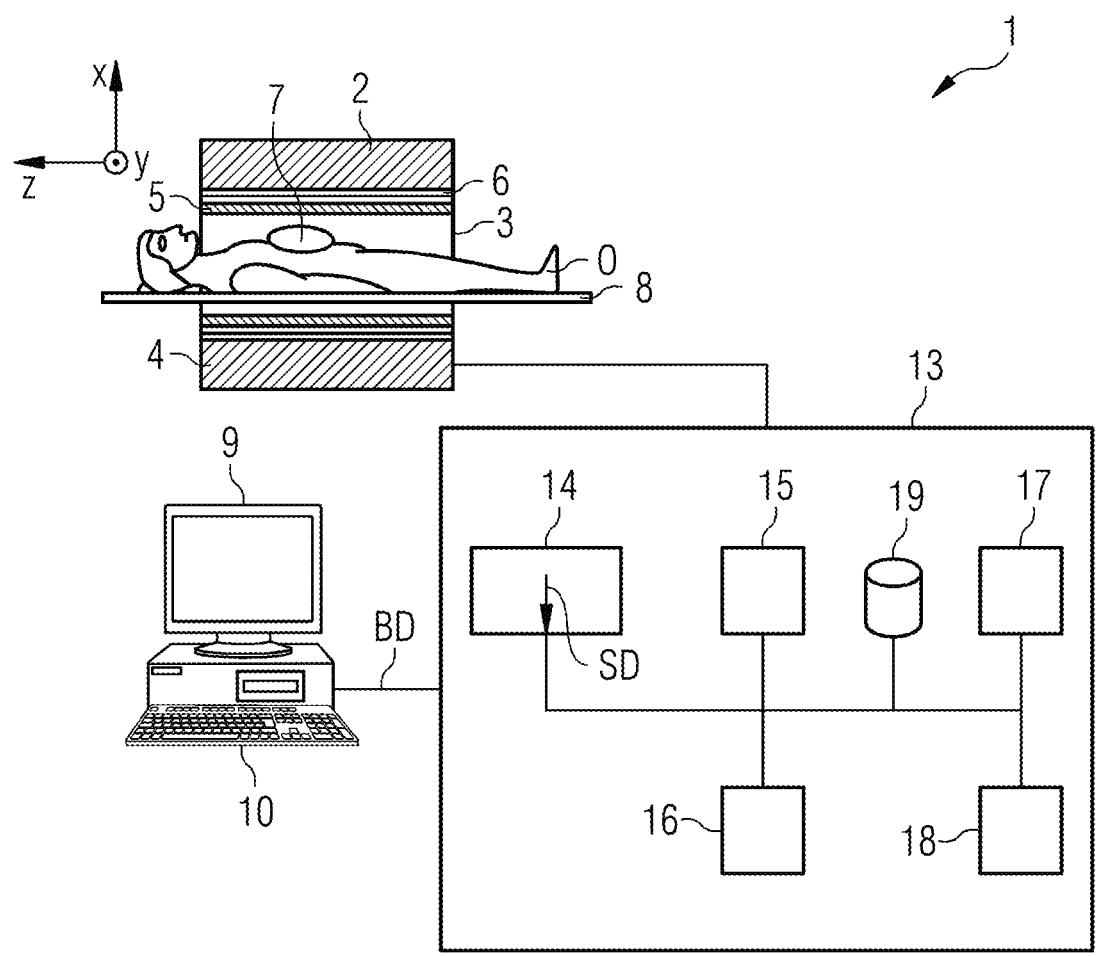
FIG. 8 schematically illustrates a magnetic resonance tomography apparatus according to an exemplary embodiment of the invention.

FIG. 8 shows a highly schematic representation of a magnetic resonance tomography apparatus 1. It includes the actual magnetic resonance scanner 2, having an examination chamber 3, i.e. a patient tunnel, and a positioning table 8 for the patient or examinee in whose body the action examination object O is located. The examination object O can be e.g. the liver, or even the entire patient.

The magnetic resonance scanner 2 is equipped in the normal manner with a basic field magnet 4, a gradient system 6 and an RF transmit antenna system 5 and RF reception antenna system 7. In the exemplary embodiment shown, the RF transmit antenna system 5 is a body coil built into the magnetic resonance scanner 2, whereas the RF reception antenna system 7 has local coils to be disposed on the patient or examinee (indicated by only a single local coil in FIG. 8). Basically, however, the body coil can also be used as an RF reception antenna system and the local coils as an RF transmit antenna system, provided these coils can be switched between different operating modes.

The basic field magnet 4 is designed in the normal manner to generate a basic magnetic field in the longitudinal direction of the patient, i.e. along the longitudinal axis of the magnetic resonance scanner 2 running in the z-direction. The gradient system 6 in the normal manner has individually controllable gradient coils in order to enable gradients to be switched independently of one another in the x, y or z-direction. The magnetic resonance scanner 2 additionally contains shim coils (not shown) which can be of normal design.

The magnetic resonance tomography apparatus 1 shown in FIG. 8 is a whole-body system having a patient tunnel in which a patient can be completely accommodated. However, the invention can basically also be used on other magnetic resonance tomography systems, e.g. having a C-shaped housing open to the side. The only essential requirement is that appropriate scans of the examination object O can be made.

The magnetic resonance tomography apparatus 1 also has a central control computer 13, which controls the MR apparatus 1. This central control computer 13 includes a sequence controller 14 that in this example is, or includes, a pulse-generating computer according to the invention. It is used to control the succession of radio-frequency pulses (RF pulses) and of gradient pulses as a function of a selected pulse sequence PS or a succession of a number of pulse sequences for scanning a number of slices in a volume region of interest of the examination object within a scanning session. Such a pulse sequence PS can be, for example, predefined or parameterized within a scanning or control protocol. Usually various control protocols for different scans or scanning sessions are stored in a memory 19 and can be selected by an operator (and possible changed if necessary) and then used to carry out the scan.

To emit the individual RF pulses of a pulse sequence PS, the central control computer 13 has a radio-frequency transmitting device 15 which generates the RF pulses, amplifies them and injects them into the RF transmit antenna system 5 via a suitable interface (not shown). For controlling the gradient coils of the gradient system 6 in order to switch the gradient pulses appropriately according to a predefined pulse sequence PS, the control computer 13 has an inventive gradient controller 16. The readout gradients A1, A2 and the encoding gradients could be applied via this gradient system interface 16. The sequence controller 14 communicates with the radio-frequency transmitting device 15 and the gradient system interface 16 in a suitable manner, e.g. by transmitting sequence control data SD, to execute the pulse sequence PS.

The control computer 13 additionally has a radio-frequency receiving device 17 (likewise communicating in a suitable manner with the sequence controller 14) in order to receive magnetic resonance signals in a coordinated manner within the readout window predefined by the pulse sequence PS, via the RF reception antenna system 7, and thus acquire the raw data. This radio-frequency receiving device 17, which can also be termed a readout unit, generally contains ADCs for data acquisition. This can be controlled using a readout window, e.g. originating from the sequence controller 14, for data collection. Additional control of the time resolution of the ADCs during a data acquisition cycle can take place so as to vary this time resolution according to a preferred embodiment as described above.

A reconstruction processor 18 receives the acquired raw data and reconstructs magnetic resonance image data therefrom. This reconstruction also generally takes place on the basis of parameters that can be predefined in the respective scanning or control protocol. The image data can then be stored, for example, in a memory 19.

Details of the manner by which suitable raw data can be acquired by injection of RF pulses and switching of gradient pulses, and by which MR images or parameter cards can be reconstructed therefrom, are familiar to those skilled in the art and thus need not be explained in greater detail herein.

The magnetic resonance image data BD can be displayed/evaluated, or the control computer 13 can be operated via a terminal having an input unit 10 and a display unit 9 via which the entire magnetic resonance tomography apparatus 1 can therefore also be operated by an operator. Magnetic resonance tomography images can also be displayed on the display unit 9 and, via the input unit 10, possibly in combination with the display unit 9, scans can be planned and initiated and, in particular, control protocols can be selected and modified if necessary.

The magnetic resonance tomography apparatus 1 according to the invention and in particular the control computer 13, can also have a large number of other components not shown individually herein, which are usually present in such systems, such as a network interface in order to enable the entire system to be connected to a network and raw data and/or image data or more specifically parameter cards, but also other data such as patient-relevant data or control protocols, to be exchanged.

The manner by which suitable raw data can be acquired by radiation of RF pulses and generation of gradient fields and by which magnetic resonance tomography images can be reconstructed therefrom are familiar to those skilled in the art, and thus need not be explained in greater detail herein. Likewise a wide variety of acquisition sequences, such as e.g. EPI sequences or other acquisition sequences for generating diffusion-weighted images, will be basically known to those skilled in the art.

It should once again be noted that the method described in detail above and the magnetic resonance tomography apparatus 1 presented are exemplary embodiments that can be modified in a variety of ways by those skilled in the art without departing from the scope of the invention. In addition, the use of the indefinite article "a" or "an" does not exclude the possibility of a plurality of the features in question also being present. Likewise, the terms "unit" and "module" do not exclude the possibility that the components in question consist of a plurality of interoperating subcomponents that may possibly also be spatially separated from one another.

The invention claimed is:

1. A computerized method for creating a pulse sequence for controlling a magnetic resonance tomography apparatus as part of a CAIPIRINHA readout method, comprising multiple readout processes, for generating magnetic resonance image data of an examination object, wherein the pulse sequence has two or more readout gradients and encoding gradients, said method comprising:
    positioning a readout gradient on a gradient axis;
    positioning an encoding gradient on another gradient axis so as to occur simultaneously with the readout gradient, said encoding gradient having a periodic waveform;
    repeating said positioning of said readout gradient and said encoding gradient so as to occur during respective different executions of said readout processes in the pulse sequence; and
    formulating said readout gradient so as to have a varying sampling density during a respective readout process, and/or formulating said encoding gradient so as to have an amplitude that varies over said respective different executions of said readout processes, and/or formulating said readout gradient so as to have an amplitude that varies over said respective different executions of said readout processes.

2. A method as claimed in claim 1 comprising formulating the encoding gradient so as to vary the amplitude of the encoding gradient over said respective different executions of said readout processes by modulating an amplitude of a periodic signal by a scaler factor that depends on a time of occurrence of respective different executions of said readout processes, and/or formulating the readout gradient so that, in respective different readout processes, by modulating an amplitude of a signal by a scaler factor that is dependent on a time of occurrence of a respective readout process in said pulse sequence.

3. A method as claimed in claim 1 comprising varying said sampling density of said readout gradient by modulating an amplitude of the readout gradient by a non-constant factor.

4. A method as claimed in claim 1 comprising varying the sampling density of the readout gradient during a respective readout process so that the sampling density in said respective readout process occurs with different sampling densities, with the sampling density being lower at a start and/or at an end of the respective readout process than in a middle of the respective readout process.

5. A method as claimed in claim 1 comprising formulating said encoding gradient with a phase-encoding gradient that occurs before and after said periodic waveform.

6. A method as claimed in claim 1 comprising creating said pulse sequence for use in a two-dimensional, Wave-CAIPI readout method, as said CAIPIRINHA readout method.

7. A method as claimed in claim 1 comprising positioning respective encoding gradients on each of two other gradient axes so as to occur simultaneously with said readout gradient on said one of said gradient axes, with amplitudes of the encoding gradients on said two other gradient axes varying for different readout processes.

8. A method as claimed in claim 7 comprising varying said amplitudes of said respective two encoding gradients non-synchronously with each other.

9. A computer for creating a pulse sequence for controlling a magnetic resonance tomography apparatus as part of a CAIPIRINHA readout method, comprising multiple readout processes, for generating magnetic resonance image data of an examination object, wherein the pulse sequence has two or more readout gradients and encoding gradients, said computer comprising a processor configured to:
position a readout gradient on a gradient axis;
position an encoding gradient on another gradient axis so as to occur simultaneously with the readout gradient, said encoding gradient having a periodic waveform;
repeating said positioning of said readout gradient and said encoding gradient so as to occur during respective different executions of said readout processes in the pulse sequence; and
formulate said readout gradient so as to have a varying sampling density during a respective readout process, and/or formulate said encoding gradient so as to have an amplitude that varies over said respective different executions of said readout processes, and/or formulate said readout gradient so as to have an amplitude that varies over said respective different executions of said readout processes.

10. A method for controlling a magnetic resonance tomography apparatus as part of a CAIPIRINHA readout method, comprising multiple readout processes, for generating magnetic resonance image data of an examination object, wherein the pulse sequence has two or more readout gradients and encoding gradients, said method comprising:
operate said magnetic resonance tomography apparatus to activate a readout gradient positioned on a gradient axis;
operate said magnetic resonance tomography apparatus to activate an encoding gradient positioned on another gradient axis so as to occur simultaneously with the readout gradient, said encoding gradient having a periodic waveform;
operate said magnetic resonance tomography apparatus to repeat said activation of said readout gradient and said encoding gradient at said positions so as to occur during respective different executions of said readout processes in the pulse sequence; and
formulating said readout gradient so as to have a varying sampling density during a respective readout process, and/or formulating said encoding gradient so as to have an amplitude that varies over said respective different executions of said readout processes, and/or formulating said readout gradient so as to have an amplitude that varies over said respective different executions of said readout processes.

11. A magnetic resonance tomography apparatus comprising:
a magnetic resonance data acquisition scanner;
a computer configured to operate the magnetic resonance data acquisition scanner as part of a CAIPIRINHA readout method, comprising multiple readout processes, for generating magnetic resonance image data of an examination object, wherein the pulse sequence has two or more readout gradients and encoding gradients;
said computer being configured to operate said magnetic resonance tomography apparatus to activate a readout gradient positioned on a gradient axis;
said computer being configured to operate said magnetic resonance tomography apparatus to activate an encoding gradient positioned on another gradient axis so as to occur simultaneously with the readout gradient, said encoding gradient having a periodic waveform;
said computer being configured to operate said magnetic resonance tomography apparatus to repeat said activation of said readout gradient and said encoding gradient at said positions so as to occur during respective different executions of said readout processes in the pulse sequence; and
said computer being configured to formulate said readout gradient so as to have a varying sampling density during a respective readout process, and/or formulate said encoding gradient so as to have an amplitude that varies over said respective different executions of said readout processes, and/or formulate said readout gradient so as to have an amplitude that varies over said respective different executions of said readout processes.

12. A non-transitory, computer-readable data storage medium encoded with programming instructions, said storage medium being loaded into a computer for controlling a magnetic resonance tomography apparatus as part of a CAIPIRINHA readout method, comprising multiple readout processes, for generating magnetic resonance image data of an examination object, wherein the pulse sequence has two or more readout gradients and encoding gradients, said programming instructions causing said computer system to:
position a readout gradient on a gradient axis;
position an encoding gradient on another gradient axis so as to occur simultaneously with the readout gradient, said encoding gradient having a periodic waveform;
repeat said positioning of said readout gradient and said encoding gradient so as to occur during respective different executions of said readout processes in the pulse sequence; and
formulate said readout gradient so as to have a varying sampling density during a respective readout process, and/or formulate said encoding gradient so as to have an amplitude that varies over said respective different executions of said readout processes, and/or formulate said readout gradient so as to have an amplitude that varies over said respective different executions of said readout processes.

* * * * *